(12) United States Patent
Suzuki et al.

(10) Patent No.: US 8,659,022 B2
(45) Date of Patent: Feb. 25, 2014

(54) HYBRID SILICON WAFER

(75) Inventors: Ryo Suzuki, Ibaraki (JP); Hiroshi Takamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/498,992

(22) PCT Filed: Oct. 28, 2010

(86) PCT No.: PCT/JP2010/069139
§ 371 (c)(1),
(2), (4) Date: Mar. 29, 2012

(87) PCT Pub. No.: WO2011/055672
PCT Pub. Date: May 12, 2011

(65) Prior Publication Data
US 2012/0187409 A1  Jul. 26, 2012

(30) Foreign Application Priority Data
Nov. 6, 2009  (JP) ................................. 2009-255016

(51) Int. Cl.
*H01L 29/04* (2006.01)
(52) U.S. Cl.
USPC ........................................... 257/64; 428/64.1
(58) Field of Classification Search
USPC ........................................... 428/64.1; 257/64
See application file for complete search history.

(56) References Cited

U.S. PATENT DOCUMENTS

| 6,406,981 | B1 * | 6/2002 | Ravi ............................... 438/489 |
| 8,236,428 | B2 | 8/2012 | Satoh et al. |
| 8,252,422 | B2 | 8/2012 | Takamura et al. |
| 2005/0066881 | A1 * | 3/2005 | Nakagawa et al. ............. 117/18 |
| 2008/0122042 | A1 * | 5/2008 | Goldstein et al. ............. 257/629 |
| 2010/0016144 | A1 | 1/2010 | Suzuki et al. |
| 2010/0187661 | A1 | 7/2010 | Suzuki et al. |
| 2010/0330325 | A1 | 12/2010 | Suzuki et al. |
| 2011/0123795 | A1 | 5/2011 | Satoh et al. |
| 2012/0009373 | A1 | 1/2012 | Takamura et al. |
| 2012/0009374 | A1 | 1/2012 | Takamura et al. |
| 2012/0181536 | A1 | 7/2012 | Suzuki et al. |

FOREIGN PATENT DOCUMENTS

| JP | 3342898 B | 9/1993 |
| JP | 6-283469 A | 10/1994 |
| JP | 3819863 B | 10/2004 |
| JP | 2005-132671 A | 5/2005 |
| JP | 2008-101277 A | 5/2008 |

\* cited by examiner

*Primary Examiner* — David Vu
*Assistant Examiner* — Brandon Fox
(74) *Attorney, Agent, or Firm* — Howson & Howson LLP

(57) ABSTRACT

A hybrid silicon wafer which is a silicon wafer having a structure wherein monocrystalline silicon is embedded in polycrystalline silicon that is prepared by the unidirectional solidification/melting method. The longitudinal plane of crystal grains of the polycrystalline portion prepared by the unidirectional solidification/melting method is used as the wafer plane, and the monocrystalline silicon is embedded so that the longitudinal direction of the crystal grains of the polycrystalline portion forms an angle of 120° to 150° relative to the cleaved surface of the monocrystalline silicon. Thus provided is a hybrid silicon wafer comprising the functions of both a polycrystalline silicon wafer and a monocrystalline wafer.

16 Claims, 2 Drawing Sheets

Plane consisting of (331), (422) and (511)

Columnar polycrystalline silicon ingot

'In the following figures, a striped pattern indicates the longitudinal direction of crystal grains of the polycrystalline portion.

Partially hollowed polycrystalline silicon ingot (diameter: 450 mm) and monocrystalline silicon ingot (diameter: 300 mm)

Complex of polycrystalline silicon and monocrystalline silicon ingot diffusion-bonded to each other Relation of angle formed by the longitudinal direction of crystal grains of polycrystalline silicon and cleavage direction of monocrystalline silicon

HYBRID SILICON WAFER

BACKGROUND

The present invention relates to a hybrid silicon wafer comprising the functions of both a polycrystalline silicon wafer and a monocrystalline wafer.

In the silicon semiconductor manufacturing process, a wafer prepared based on monocrystal growth is primarily used. This monocrystalline silicon wafer has increased in size with the times, and it is anticipated that the inner diameter thereof will become 400 mm or larger in the near future. In addition, a so-called mechanical wafer for use in testing is now required in order to establish the apparatus and peripheral technology necessary for the semiconductor manufacturing process.

Generally speaking, since this kind of mechanical wafer is subject to fairly high precision testing, it needs to possess characteristics that are similar to the mechanical physicality of a monocrystalline silicon. Thus, conventionally, although it was to be used for testing, in reality the monocrystalline silicon wafer was being used as is. However, since a monocrystalline silicon wafer having an inner diameter of 400 mm or larger is extremely expensive, an inexpensive wafer having characteristics that are similar to a monocrystalline silicon is in demand.

Meanwhile, as a component of such semiconductor manufacturing equipment, a proposal has also been made for using a sputtering target formed from a rectangular or disk-shaped silicon plate. The sputtering method is being used as a means for forming thin films, and there are several sputtering methods including the bipolar DC sputtering method, radio frequency sputtering method, magnetron sputtering method and the like, and thin films of various electronic parts are being formed using the sputtering characteristics unique to the respective methods.

This sputtering method is a method that faces a substrate as the anode and a target as the cathode, and generates an electrical field by applying a high voltage between the foregoing substrate and target under an inert gas atmosphere. Here, the ionized electrons and inert gas collide to form a plasma, the cations in the plasma collide with the target surface to hammer out the target constituent atoms, and the discharged atoms adhere to the opposite substrate surface so as to form a film.

A polycrystalline silicon sintered compact is proposed for this kind of sputtering target, and this sintered compact target is demanded of considerable thickness, large size and a rectangular or disk shape in order to improve the deposition efficiency. Moreover, a proposal has also been made for using this polycrystalline silicon sintered compact as a board for retaining the monocrystalline silicon wafer. Nevertheless, a polycrystalline silicon entails significant problems in that the sinterability is inferior, the obtained products have low density, and the mechanical strength is low.

In light of the above, in order to improve the characteristics of the foregoing silicon sintered compact, proposed is a silicon sintered compact formed by compression-molding and sintering silicon powder obtained by being heated and deoxidized under reduced pressure and within a temperature range that is 1200° C. or higher and less than the melting point of silicon, and setting the crystal grain size of the sintered compact to be 100 μm or less (for instance, refer to Patent Document 1).

If the thickness of the silicon sintered compact manufactured as described above is thin; for instance, 5 mm or less, the density will relatively increase and the strength will also increase, however, the thickness becomes much thicker the density will continue to be a low density (less than 99%), and the mechanical strength will also deteriorate. Thus, there is a problem in that manufacturing a large-size rectangular or disk-shaped silicon sintered compact is not possible.

In light of the foregoing circumstances, the present applicant previously proposed a silicon sintered compact and its production method in which the average crystal grain size is 50 μm or less and the relative density is 99% or more (refer to Patent Document 2).

Although this silicon sintered compact possesses numerous advantages including high density and high mechanical strength, the further improvement of these characteristics is being demanded, and the applicant filed a patent application relating to technology that improved the foregoing points.

Since a wafer using the foregoing silicon sintered compact has similar mechanical properties as a monocrystalline silicon, it can be used as a dummy wafer for the transport system of semiconductor manufacturing equipment or the development of robotics. In addition, the application of an SOI wafer as a base substrate is also being considered.

Nevertheless, these are all polycrystalline silicons made from a silicon sintered compact, and although there are numerous points that are similar to the physical properties of a monocrystal, they do not possess the functions as the monocrystal itself, and there is a fundamental problem in that they cannot be used for process testing such as deposition experiments.

There is also a proposal of manufacturing a high quality polycrystalline silicon in substitute for a monocrystalline silicon (refer to Patent Document 3). Nevertheless, a polycrystalline silicon has a drawback in that, no matter what kind of devisal is made, its characteristics will be inferior to a monocrystalline silicon.

Moreover, with respect to the patent application that was previously filed by the applicant, since a sintered silicon is used at a polycrystalline portion, the crystal orientation becomes random, and there is a problem in that unevenness occurs during the grinding process, and a problem in that a large amount of gas component impurities will be included (refer to Patent Document 4).

[Patent Document 1] Japanese Patent No. 3342898
[Patent Document 2] Japanese Patent No. 3819863
[Patent Document 3] Japanese Unexamined Patent Application Publication No. 2005-132671
[Patent Document 4] Japanese Patent Application No. 2008-179988

SUMMARY OF THE INVENTION

As described above, the shape of a monocrystalline wafer that is used in the LSI process is becoming a greater diameter with the times, and a monocrystalline wafer having a diameter of 400 mm or more is becoming standard. Nevertheless, a monocrystalline wafer having a diameter of 400 mm or more is extremely expensive, and consequently its dummy wafer is also expensive, and costs of the LSI process will thereby increase. Moreover, with a monocrystalline silicon wafer of a large diameter; for instance, a diameter of 400 mm or more, there is concern that the cracks of the monocrystalline cleavage surface will increase and the production yield will deteriorate compared to a conventional 300 mm wafer.

Thus, an object of the present invention is not only to inexpensively provide a hybrid wafer by using a general-purpose 300 mm monocrystal and which can be applied to a dummy wafer of 400 mm or larger, but also to improve the production yield by improving the strength of the dummy wafer. In other words, an object of the present invention is to provide a hybrid silicon wafer comprising the functions of both a polycrystalline silicon wafer and a monocrystalline silicon wafer.

Although a sintered silicon may be used at the polycrystalline silicon portion of the hybrid wafer, since there is a large amount of gas components such as C and O compared to a melted Si ingot, and SiC and $SiO_2$ of high hardness precipitate at the crystal grain boundary, the polishing rate is slow in the mirror polishing process compared to the monocrystalline silicon portion, and there is a problem in that unevenness will occur in the thickness of the monocrystalline silicon portion and the polycrystalline silicon portion. Thus, an object of this invention is to provide a hybrid silicon wafer capable of overcoming the foregoing problems.

In order to achieve the foregoing object, the present inventors discovered that it is possible to obtain a polycrystalline silicon with improved mechanical strength, and achieve a hybrid silicon wafer comprising functions of both the polycrystalline silicon wafer and the monocrystalline silicon wafer by embedding monocrystalline silicon in the foregoing polycrystalline silicon.

Based on the foregoing discovery, the present invention provides:

1) A hybrid silicon wafer which is a silicon wafer having a structure wherein monocrystalline silicon is embedded in polycrystalline silicon that is prepared by a unidirectional solidification/melting method;
2) The hybrid silicon wafer according to 1) above, wherein bonding interfaces of the polycrystalline silicon prepared by the unidirectional solidification/melting method and the monocrystalline silicon are diffusion-bonded;
3) The hybrid silicon wafer according to 1) or 2) above, wherein the area ratio of the monocrystalline silicon relative to the entire area of the wafer surface is 30% or more;
4) The hybrid silicon wafer according to any one of 1) to 3) above, wherein the plane orientation of the polycrystalline silicon portion prepared by the unidirectional solidification/melting method consists of (331), (422), and (511);
5) The hybrid silicon wafer according to any one of 1) to 4) above, wherein the longitudinal plane of crystal grains of the polycrystalline portion prepared by the unidirectional solidification/melting method is used as the wafer plane, and the monocrystalline silicon is embedded so that the longitudinal direction of the crystal grains of the polycrystalline portion forms an angle of 120° to 150° relative to the cleaved surface of the monocrystalline silicon;
6) The hybrid silicon wafer according to any one of 1) to 5) above, wherein the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less;
7) The hybrid silicon wafer according to any one of 1) to 6) above, wherein C and O as the gas components of the polycrystalline silicon portion are respectively 100 wtppm or less; and
8) The hybrid silicon wafer according to any one of 1) to 7) above, wherein the wafer is a disk shape and the diameter of the overall wafer is 400 mm or more.

Since it is possible to provide a hybrid silicon wafer comprising functions of both the polycrystalline silicon wafer and the monocrystalline wafer based on the above, a significant effect is yielded in that the characteristics and functions as a monocrystalline wafer and the characteristics and functions as a polycrystalline silicon wafer can be simultaneously retained.

A polycrystalline silicon wafer as the support base of the hybrid silicon wafer needs to be enlarged and strengthened by necessity.

The polycrystalline silicon wafer which the hybrid silicon wafer of the present invention comprises characteristics that are similar to the mechanical properties of monocrystalline silicon that is used as a mechanical wafer. Specifically, since the strength is high, it is free from cracks and chipping, and it can be easily processed into complex shapes, and the polycrystalline silicon wafer can be machined for embedding the monocrystalline silicon. Based on these characteristics, a small diameter monocrystalline silicon that is relatively inexpensive can be used, and monocrystalline silicon of an appropriate size can be embedded in the required portion.

Moreover, since the polycrystalline silicon can also be manufactured as a large ingot, a hybrid silicon wafer can be manufactured by embedding a monocrystalline ingot in the large ingot, bonding the interfaces thereof, and slicing the bonded body. Accordingly, a hybrid silicon wafer comprising functions of both the polycrystalline silicon wafer and the monocrystalline wafer has a significant feature of being able to considerably improve the production yield and reduce manufacturing costs compared to an independent monocrystalline wafer of the same size. In other words, as a result of using a polycrystalline silicon ingot for use in solar cells and a 300 mm monocrystalline silicon, it is possible to prepare an inexpensive dummy silicon wafer of 400 mm or larger.

Furthermore, a dummy silicon wafer prepared by using a polycrystalline silicon ingot having a purity of 6N or higher is characterized in that it will not contaminate the process unit or other components even when it is introduced into the process unit. Moreover, since a silicon ingot prepared based on the unidirectional solidification method is used as the polycrystalline silicon and the solidifying direction (longitudinal direction of the crystal grains) is set at an angle of 120° to 150° relative to the cleaved surface of the embedded monocrystal, a significant effect is yielded in that the wafer strength can be increased, and the deterioration in the production yield caused by cracks in the cleavage of the wafer can be prevented.

DETAILED DESCRIPTION

Figure 1:
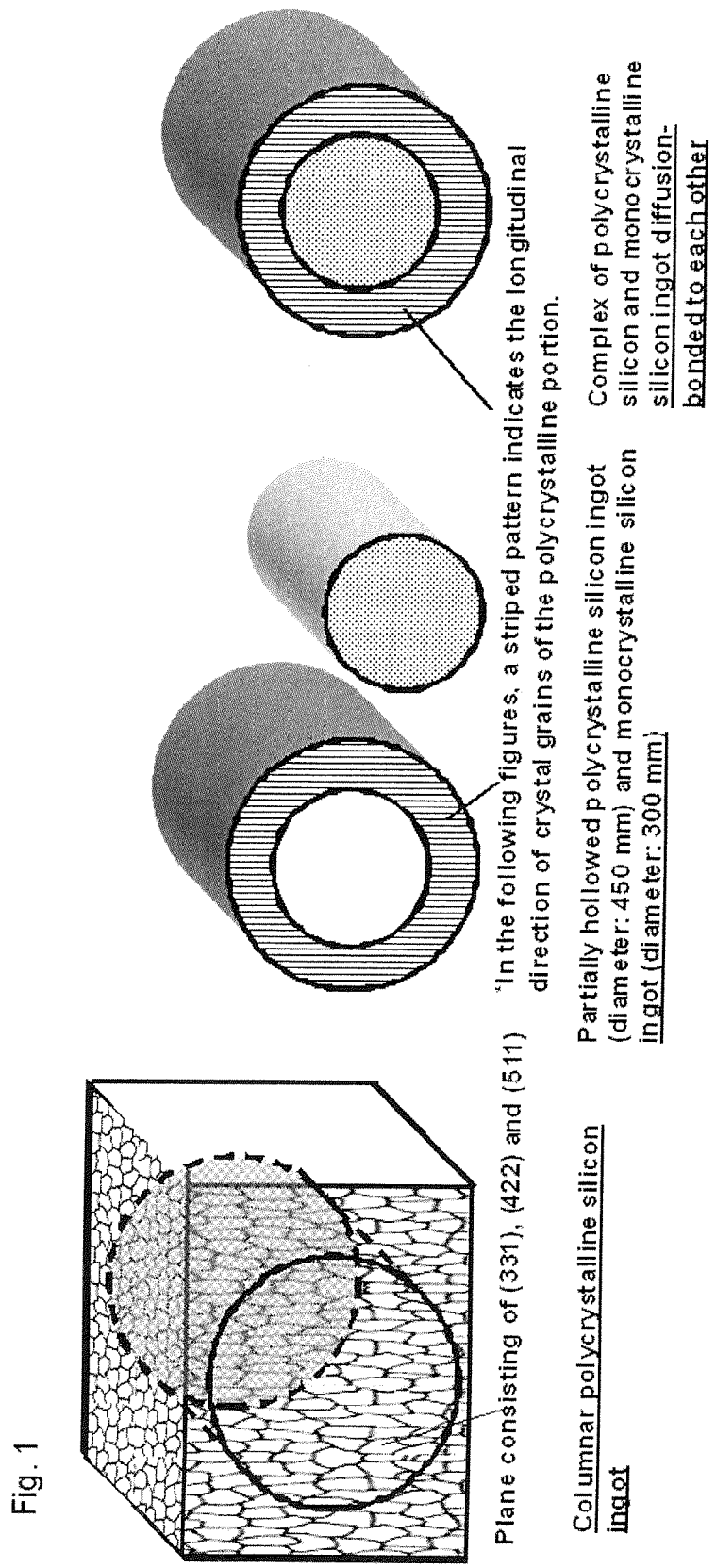
FIG. 1 is an explanatory diagram of the process of using a polycrystalline silicon ingot, hollowing a part of this polycrystalline silicon ingot, and inserting a pre-produced monocrystalline ingot into the hollowed portion.

The hybrid silicon wafer of the present invention comprises a structure in which a monocrystalline wafer is embedded in the polycrystalline silicon wafer. Specifically, a single hybrid silicon wafer has a structure in which a polycrystalline silicon wafer and a monocrystalline wafer coexist. To put it differently, this hybrid silicon wafer takes on a structure in which a monocrystalline wafer is retained in the polycrystalline silicon wafer. The respective surfaces of the polycrystalline silicon wafer and the monocrystalline wafer are exposed on the surface, and comprise an equal polished surface since they are simultaneously subject to machining and processing during the manufacturing stage. Under normal circumstances, the difference in surface roughness Ra of the respective surfaces of the polycrystalline silicon wafer and the monocrystalline wafer is desirably 0.02 µm or less.

In particular, the hybrid silicon wafer is unique in that it has a structure wherein the monocrystalline silicon is embedded in the polycrystalline silicon prepared by the unidirectional solidification/melting method. The greatest weakness of the monocrystalline silicon wafer is the deterioration of the breaking strength (deflecting strength), but the present invention is able to overcome this weakness.

Desirably, the bonding interfaces of the polycrystalline silicon prepared by the unidirectional solidification/melting method and the monocrystalline silicon are diffusion-bonded. It is thereby possible to reliably bond the two silicons. Moreover, desirably, the area ratio of the monocrystalline silicon relative to the entire area of the wafer surface is 30% or more. This is in aim to increase the area of effectively utilizing the monocrystalline silicon.

With the hybrid silicon wafer of the present invention, desirably, the plane orientation of the polycrystalline silicon portion prepared by the unidirectional solidification/melting method consists of (331), (422), and (511). This is in aim to effectively utilize the strength of the polycrystalline silicon.

Moreover, as an even more preferable structure, the longitudinal plane of crystal grains of the polycrystalline portion prepared by the unidirectional solidification/melting method is used as the wafer plane, and the monocrystalline silicon is embedded so that the longitudinal direction of the crystal grains of the polycrystalline portion forms an angle of 120° to 150° relative to the cleaved surface of the monocrystalline silicon. This is in order to increase the breaking strength of the hybrid silicon wafer as described in the ensuing Examples.

With the hybrid silicon wafer, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. Moreover, desirably, C and O as the gas components of the polycrystalline silicon portion are respectively 100 wtppm or less. A dummy silicon wafer prepared as described above is unique in that it will not, even when introduced into the process unit; contaminate the unit and other members. It is thereby possible to further increase the utility value of a disk shape wafer having an overall diameter of 400 mm or larger.

The polycrystalline silicon wafer to become the support base of the monocrystalline silicon wafer can be manufactured in a large size. Meanwhile, it is extremely expensive to prepare a monocrystalline silicon in a large size exceeding an inner diameter of 400 mm. However, with a polycrystalline silicon wafer, it is easy to prepare a silicon wafer having an inner diameter of 400 mm or more.

Accordingly, for instance, a hybrid wafer in which a disk-shaped monocrystalline silicon wafer is embedded in a part of a disk-shaped polycrystalline silicon wafer having an inner diameter of 400 mm or more can be manufactured easily and inexpensively.

It should be easy to understand that the shape of these wafers is not limited to a disk shape but may be manufactured in a rectangular shape or the like. And the shape of the monocrystalline silicon to be embedded is not limited to a disk shape, but can also be prepared in a rectangular, ellipse/oval, race track shape or the like.

Although there is no particular limitation regarding the size of the monocrystalline silicon, desirably, the longest diameter of the monocrystalline silicon portion is 50% or more of the diameter of the overall wafer. Consequently, the hybrid silicon wafer can be effectively utilized in tests that use the characteristics of a monocrystalline wafer. This is particularly effective when causing the embedding position of the monocrystal to be eccentric and testing the distribution in the radial direction.

Moreover, since the monocrystalline silicon portion can be embedded in various shapes simultaneously such as a rectangular, ellipse/oval, race track shape in addition to a disk shape, in the foregoing case, the surface area of the monocrystalline silicon portion can be made to be 30% or more of the surface area of the overall wafer.

Nevertheless, the present invention is not limited to the foregoing shapes. Limitation in the size is the size of the monocrystalline wafer that can be retained in the polycrystalline silicon wafer, and there is no particular limitation. Moreover, it is also possible to embed a monocrystalline wafer that is smaller than the foregoing examples. Furthermore, in order to increase the bonding strength of the polycrystalline silicon wafer and the monocrystalline wafer, desirably, the bonding interfaces are mutually diffusion-bonded. Depending on the usage, an adhesive layer may also be inserted therebetween.

Upon manufacturing the hybrid silicon wafer of the present invention, as described above, a part of the polycrystalline silicon that is prepared in advance via the unidirectional solidification/melting method is hollowed, a monocrystalline ingot is inserted into the hollowed portion, and the polycrystalline sintered silicon and the monocrystalline ingot are mutually bonded through thermal diffusion bonding to prepare a complex of the polycrystalline sintered silicon and the monocrystalline silicon ingot. Subsequently, the complex is sliced to prepare a hybrid silicon wafer having a structure in which a monocrystalline wafer is embedded in a polycrystalline silicon.

This manufacturing method aims to manufacture numerous hybrid silicon wafers at once, but a hybrid silicon wafer can also be manufactured one by one as a matter of course.

In the foregoing case, in order to improve the strength of the hybrid silicon wafer, it is effective to adjust the plane orientation of the polycrystalline silicon portion prepared by the unidirectional solidification/melting method to (331), (422), and (511). Moreover, desirably, the longitudinal plane of crystal grains of the polycrystalline portion prepared by the unidirectional solidification/melting method is used as the wafer plane, and the monocrystalline silicon is embedded so that the longitudinal direction of the crystal grains of the polycrystalline portion forms an angle of 120° to 150° relative to the cleaved surface of the monocrystalline silicon. It is thereby possible to reliably improve the strength of the hybrid silicon wafer.

Moreover, upon manufacturing the hybrid silicon wafer of the present invention, in order to achieve the same characteristics as a monocrystalline silicon wafer, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. More preferably, C and O as the gas components of the polycrystalline silicon portion are respectively 100 wtppm or less. It is thereby possible to improve the overall characteristics of the hybrid silicon wafer.

Upon slicing the complex to prepare the hybrid silicon wafer, the plane orientation of the sliced monocrystalline wafer can be adjusted relative to the polycrystalline silicon portion as described above, and the monocrystalline silicon ingot can be embedded in the polycrystalline silicon. It is thereby possible to form a monocrystalline silicon wafer with mutually adjusted plane orientations simply by slicing the monocrystalline wafer portion of the hybrid silicon wafer. The sliced monocrystalline wafer obtained as described above and the polycrystalline silicon wafer are simultaneously processed and polished to manufacture a hybrid silicon wafer.

The foregoing hybrid silicon wafer is able to effectively utilize the function as a monocrystalline wafer. Not only can it be used as a mechanical wafer (or a dummy wafer), it can also be used as a test wafer of equipment testing such as deposition experiments on a monocrystal. Moreover, since the function as the polycrystalline silicon wafer; that is, the mechanical strength is high and the workability is superior, the present invention can also be used as a sputtering target or various parts of semiconductor manufacturing equipment such as a holder. Upon manufacturing polycrystalline parts, the silicon wafer is free from the generation of cracks and chipping and can also be easily processed into complex shapes, and therefore yields a superior effect of being able to considerably improve the production yield and reduce the manufacturing costs.

Accordingly, the "hybrid silicon wafer" of the present invention is available for multipurpose utilization, and a silicon wafer comprising the foregoing characteristics did not conventionally exist.

EXAMPLES

The present invention is now explained in detail with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course.

Example 1

Based on the unidirectional solidification/melting method, prepared was a columnar structure polycrystalline silicon ingot wherein the purity is 6N, the impurity concentration of Cu, Fe, Ni, and Al is 0.1 ppm or less, respectively, and the oxygen and carbon content is 100 ppm or less. In the foregoing case, the plane direction of the columnar structure polycrystalline silicon that was prepared by the unidirectional solidification/melting method consisted of (331), (422), and (511). Moreover, in this Example, in order to increase the purity of the polycrystalline silicon portion as much as possible, used was a raw material in which the purity excluding gas components is 6N or higher, the total amount of metal impurities is 1 wtppm or less, and, among the metal impurities, Cu, Fe, Ni, and Al are respectively 0.1 wtppm or less, and C and O as gas components are respectively 100 wtppm or less.

Subsequently, as shown in FIG. 1, this polycrystalline silicon (diameter of 450 mm) ingot was used, a part of the polycrystalline silicon ingot was hollowed, and a pre-produced monocrystalline ingot (diameter of 300 mm) was inserted into the hollowed portion. Here, the setting was in 15° intervals so that the angle formed by the longitudinal direction of the crystal grains of the polycrystalline silicon and the cleaved surface of the monocrystalline silicon becomes 90° to 180°. With the respective ingots, the plane orientation of the side face of the columnar structure polycrystalline silicon ingot was (331), (422), and (511) as described above. Meanwhile, the surface obtained by slicing the monocrystalline silicon ingot usually possesses the (100) orientation.

The clearance between the polycrystalline silicon ingot and the monocrystalline ingot was set to 0.1 mm or less. Subsequently, the polycrystalline silicon ingot and the monocrystalline ingot were mutually subject to thermal diffusion-bonding based on HIP by being heat at 1200° C. for 2 hours, and a complex of the polycrystalline silicon and monocrystalline silicon ingots.

Subsequently, the complex was sliced into a thickness of 1.01 mm, and a hybrid wafer having a structure where a monocrystalline wafer having a diameter of 300 mm is embedded in a polycrystalline silicon wafer having a diameter of 450 mm was prepared. Next, the sliced surface was subject to rough grinding and precision polishing to obtain a mirrored hybrid silicon wafer having a thickness of 0.925 mm, and an average surface roughness of Ra 0.02 μm.

Consequently, it was possible to obtain a hybrid silicon wafer having a structure where a monocrystalline wafer is embedded in a polycrystalline silicon wafer which is free from peeling and cracks, and in which the bonding interface is free from the generation of pores.

Figure 2:
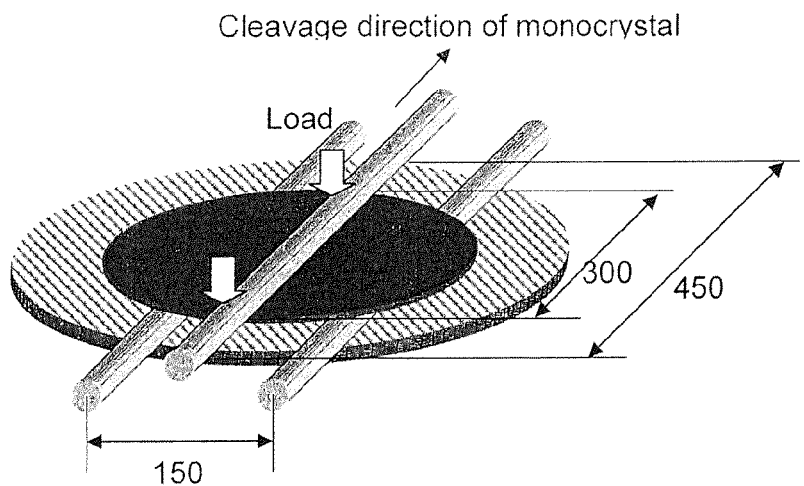
FIG. 2 is a diagram showing the test example for measuring the relation of the longitudinal direction of the crystal grain shape of the polycrystalline silicon portion and the load at which the wafer will crack upon applying a bending load in the direction along the cleaved surface of the monocrystalline wafer.

Subsequently, the load at which the wafer would break upon applying a bending load in a direction along the cleaved surface of the monocrystalline wafer was compared. This test was performed, as shown in FIG. 2, by setting all sample sizes to a diameter of 450 mm and a thickness of 925 μm, and, with a rod that is sufficiently longer than the wafer and which passes through the center of the wafer, and two rods that are symmetrically separated at 150 mm from that line were used as the fulcrum, and the breaking load in the case of three-point bending was measured.

Figure 3:
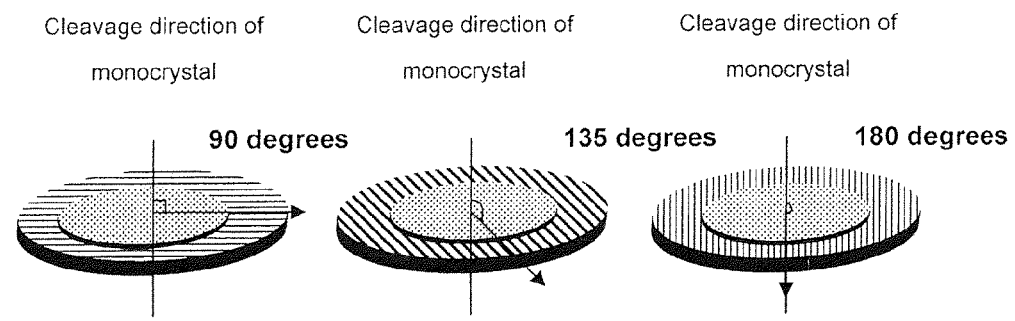
FIG. 3 is a diagram showing the relation of the angle formed by the longitudinal direction of the crystal grains of the polycrystalline silicon and the cleavage direction of the monocrystalline silicon.

The test results are shown in Table 1. Also, the relation of the angle formed by the longitudinal direction of the crystal grains of the polycrystalline silicon and the cleavage direction of the monocrystalline silicon is shown in FIG. 3. FIG. 3 shows the cases where the angles 90°, 135°, and 180°.

Based on Table 1, it was confirmed that the increases when the angle formed by the longitudinal direction of the crystal grains of the polycrystalline silicon and the cleaved surface of the monocrystalline silicon is particularly within the range of 120° to 150°. Nevertheless, even within the ranges of 90° to 120° and 150° to 180°, the breaking load is in the level of 14.5 to 17.5 Kgf.

If there is not such a high demand for the strength of the hybrid silicon wafer having a structure where the monocrystalline wafer is embedded in the polycrystalline silicon wafer, there is no need to give particular attention to this kind of breaking load, but in cases where the improvement of the breaking load is particularly demanded, it would be desirable to use the longitudinal plane of crystal grains of the polycrystalline portion as the wafer plane, and embed the monocrystalline silicon so that the longitudinal direction of the crystal grains of the polycrystalline portion forms an angle of 120° to 150° relative to the cleaved surface of the monocrystalline silicon.

TABLE 1

| Angle (°) | breaking load (Kgf) |
|---|---|
| 90 | 14.5 |
| 105 | 17.5 |
| 120 | 25.0 |

TABLE 1-continued

| Angle (°) | breaking load (Kgf) |
|---|---|
| 135 | 29.0 |
| 150 | 26.5 |
| 165 | 16.0 |
| 180 | 15.0 |

When using the polycrystalline silicon wafer prepared by the unidirectional solidification/melting method as described above, since the strength of the polycrystalline silicon wafer can be adjusted and the breaking load can be sufficiently increased as a result of adjusting the crystal orientation and/or the crystal grain shape, for instance, when processed into a hybrid silicon wafer, there were no cracks or chipping even when the diameter of the wafer was increased to 400 mm, 450 mm, and 680 mm. The monocrystalline silicon wafer has a (100) orientation.

Moreover, the monocrystalline silicon wafer and the hybrid silicon wafer prepared in this Example were superimposed, subject to heat treatment at 800° C. in an argon airflow, and the contact surface of the monocrystalline silicon was measured to obtain the impurity transfer from the hybrid silicon wafer using TXRF (Total Reflection X-ray Fluorescence). Consequently, the cleanliness factor before the heat treatment was maintained.

Note that, since the inclusion of impurities in the polycrystalline silicon is undesirable, silicon having a purity of 6N was used, but even silicon having a purity level of 5N can be used without any problem so as long as the respective metal impurity components; namely, Cu, Fe, Ni, and Al are 0.1 ppm or less, respectively. Moreover, when the purity of silicon is 5N or higher, the mechanical properties were not affected in any way.

Example 2

Prepared was a hybrid silicon wafer in which Cu and Fe as impurities in the polycrystalline silicon portion were respectively 0.5 wtppm and 0.3 wtppm, Ni and Al were respectively 0.1 wtppm or less, and the purity excluding gas components was 6N or higher.

In the foregoing case, upon conducting a thermal transfer test in order to examine the influence of Cu and Fe as impurities, transfer of Cu and Fe to the contacted monocrystalline wafer was observed. Accordingly, this cannot be used as a dummy wafer for use in a process including heat treatment at a high temperature.

However, the influence of Cu and Fe as impurities was not that significant, and this could be sufficiently used as a dummy wafer in a process that does not include heat treatment at a high temperature.

Example 3

Prepared was a hybrid silicon wafer in which Cu, Fe, Ni, and Al as impurities in the polycrystalline silicon portion were respectively 0.8 wtppm, 1.2 wtppm, 0.3 wtppm, and 0.6 wtppm, and the purity excluding gas components was 5N or higher.

In the foregoing case, upon conducting a thermal transfer test in order to examine the influence of Cu, Fe, Ni, and Al as impurities, transfer of Cu, Fe, Ni, and Al to the contacted monocrystalline wafer was observed. However, the transfer of other impurities could not be observed.

Accordingly, this cannot be used as a dummy wafer for use in a process including heat treatment at a high temperature.

However, the influence of Cu, Fe, Ni, and Al as impurities was not that significant, and this could be sufficiently used as a dummy wafer in a process that does not include heat treatment at a high temperature.

Based on foregoing Example 2 and Example 3, for use as a dummy wafer in a process including heat treatment at a high temperature, desirably, the purity of the polycrystalline silicon portion excluding gas components is 6N or higher, the total amount of metal impurities is 1 wtppm or less, and, among the metal impurities, Cu, Fe, Ni, and Al are respectively 0.1 wtppm or less. However, when the influence of Cu, Fe, Ni, and Al as impurities is not that significant; that is, even in cases of a hybrid silicon wafer of a 5N-level polycrystalline silicon portion, it was confirmed that this could be sufficiently used as a dummy wafer in a process that does not include heat treatment at a high temperature.

Since it is possible to provide a hybrid silicon wafer comprising functions of both the polycrystalline silicon wafer prepared by the unidirectional solidification/melting method and the monocrystalline wafer based on the above, a significant effect is yielded in that the characteristics and functions as a monocrystalline wafer and the characteristics and functions as a polycrystalline silicon wafer prepared by the unidirectional solidification/melting method can be simultaneously retained.

A polycrystalline silicon wafer as the support base of the hybrid silicon wafer needs to be enlarged and strengthened by necessity. The polycrystalline silicon wafer prepared by the unidirectional solidification/melting method which the hybrid silicon wafer of the present invention comprises has characteristics that are improved compared to the mechanical properties of monocrystalline silicon that is used as a mechanical wafer.

Specifically, the strength is high, it is free from cracks and chipping, and the polycrystalline silicon wafer can be easily processed into complex shapes. Thus, since a hybrid silicon wafer comprising functions of both the polycrystalline silicon wafer and the monocrystalline wafer has a significant feature of being able to considerably improve the production yield and reduce manufacturing costs, it is effective as a test wafer of a deposition system and the like, and also as various parts of semiconductor manufacturing equipment.

The invention claimed is:

1. A hybrid silicon wafer, comprising a silicon wafer having a structure wherein monocrystalline silicon is embedded in polycrystalline silicon and bonding interfaces of the polycrystalline silicon and the monocrystalline silicon are diffusion-bonded and wherein a plane orientation of the polycrystalline silicon of the silicon wafer consists of (331), (422), and (511).

2. The hybrid silicon wafer according to claim 1, wherein an area ratio of the monocrystalline silicon of the silicon wafer relative to the entire area of a surface of the silicon wafer is 30% or more.

3. The hybrid silicon wafer according to claim 2, wherein a longitudinal plane of crystal grains of the polycrystalline silicon of the silicon wafer forms a wafer plane, and the monocrystalline silicon is embedded so that a longitudinal direction of the crystal grains of the polycrystalline silicon of the silicon wafer forms an angle of 120° to 150° relative to a cleaved surface of the monocrystalline silicon.

4. The hybrid silicon wafer according to claim 3, wherein purity of the polycrystalline silicon of the silicon wafer excluding gas components is 6N or higher, total amount of metal impurities is 1 wtppm or less, and, among the metal impurities, Cu, Fe, Ni, and Al are respectively 0.1 wtppm or less.

5. The hybrid silicon wafer according to claim 4, wherein C and O as the gas components of the polycrystalline silicon of the silicon wafer are respectively 100 wtppm or less.

6. The hybrid silicon wafer according to claim 5, wherein the wafer is a disk shape, and diameter of the wafer is 400 mm or more.

7. The hybrid silicon wafer according to claim 1, wherein a longitudinal plane of crystal grains of the polycrystalline silicon of the silicon wafer forms a wafer plane, and the monocrystalline silicon is embedded so that a longitudinal direction of the crystal grains of the polycrystalline silicon of the silicon wafer forms an angle of 120° to 150° relative to a cleaved surface of the monocrystalline silicon.

8. The hybrid silicon wafer according to claim 1, wherein purity of the polycrystalline silicon of the silicon wafer excluding gas components is 6N or higher, a total amount of metal impurities is 1 wtppm or less, and, among the metal impurities, Cu, Fe, Ni, and Al are respectively 0.1 wtppm or less.

9. The hybrid silicon wafer according to claim 8, wherein C and O as the gas components of the polycrystalline silicon of the silicon wafer are respectively 100 wtppm or less.

10. The hybrid silicon wafer according to claim 1, wherein the wafer is a disk shape, and a diameter of the wafer is 400 mm or more.

11. A hybrid silicon wafer, comprising:
a single crystal silicon and a polycrystalline silicon having a structure in which the single crystal silicon is embedded in the polycrystalline silicon and such that each of two opposed surfaces of the hybrid silicon wafer consists of a surface partially formed by the single crystal silicon and partially formed by the polycrystalline silicon;
the single crystal silicon and the polycrystalline silicon being diffusion-bonded to each other at an interface thereof;
the polycrystalline silicon having a texture resulting from being formed from an ingot manufactured by a process including melting and unidirectional solidification; and
a surface of the polycrystalline silicon, which partially forms the surface of the hybrid silicon wafer, having been cut from the ingot manufactured by the process including melting and unidirectional solidification such that the surface of the polycrystalline silicon is parallel to a pulling direction applied in the process including unidirectional solidification, the texture of the polycrystalline silicon being such that the surface of the polycrystalline silicon consists essentially of crystal grain faces of (331), (422) or (511).

12. The hybrid silicon wafer according to claim 11, wherein a surface of the single crystal silicon which partially forms the surface of the hybrid silicon wafer has an area of 30% or more relative to an area of the surface of the hybrid silicon wafer.

13. The hybrid silicon wafer according to claim 11, wherein the ingot manufactured by the process including melting and unidirectional solidification being composed of elongated crystal grains in which a longitudinal direction thereof being substantially parallel to the pulling direction applied in the process including unidirectional solidification such that the surface of the polycrystalline silicon that partially forms the surface of the hybrid silicon wafer is parallel to the longitudinal direction of the elongated crystal grains, and the longitudinal direction of the elongated crystal grains in the surface of the polycrystalline silicon is oriented at an angle of 120° to 150° relative to a cleavage surface of the single crystal silicon.

14. The hybrid silicon wafer according to claim 11, wherein the polycrystalline silicon has a purity of 6N or higher, excluding contents of gas components, and wherein a total content of metal impurities in the polycrystalline silicon is 1 wtppm or less including a content of each of Cu, Fe, Ni and Al metal impurities of 0.1 wtppm or less.

15. The hybrid silicon wafer according to claim 14, wherein the polycrystalline silicon has a content of each of C and O as gas components of 100 wtppm or less.

16. The hybrid silicon wafer according to claim 11, wherein the hybrid silicon wafer has a disk shape with a diameter of 400 mm or more.

* * * * *